United States Patent
Feng (10) Patent No.: US 10,650,734 B2
(45) Date of Patent: May 12, 2020

(54) ARRAY SUBSTRATE AND DRIVING METHOD, DISPLAY PANEL AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventor: Youxiong Feng, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 116 days.

(21) Appl. No.: 15/865,898

(22) Filed: Jan. 9, 2018

(65) Prior Publication Data

US 2018/0342201 A1 Nov. 29, 2018

(30) Foreign Application Priority Data

May 27, 2017 (CN) .......................... 2017 1 0388033

(51) Int. Cl.
*G09G 3/32* (2016.01)
*G09G 3/3208* (2016.01)
*H01L 51/52* (2006.01)
*G09G 3/3233* (2016.01)

(52) U.S. Cl.
CPC ......... *G09G 3/3208* (2013.01); *G09G 3/3233* (2013.01); *H01L 51/5203* (2013.01); *G09G 2300/0819* (2013.01); *G09G 2310/021* (2013.01); *G09G 2310/0216* (2013.01); *G09G 2310/0264* (2013.01)

(58) Field of Classification Search
CPC combination set(s) only.
See application file for complete search history.

(56) References Cited

U.S. PATENT DOCUMENTS

| 2013/0147692 A1 | 6/2013 | Yamashita et al. |
| 2014/0347405 A1 | 11/2014 | Kumeta et al. |
| 2015/0379930 A1* | 12/2015 | Lee ...................... G09G 3/3233 345/76 |

(Continued)

FOREIGN PATENT DOCUMENTS

| CN | 102654701 A | 9/2012 |
| CN | 203480807 U | 3/2014 |
| CN | 104091559 A | 10/2014 |

(Continued)

OTHER PUBLICATIONS

China First Office Action, Application No. 201710388033.1, dated Oct. 8, 2018, 23 pps.: with English translation.

*Primary Examiner* — Deeprose Subedi (74) *Attorney, Agent, or Firm* — Armstrong Teasdale LLP (57) ABSTRACT

Embodiments of the disclosure provide an array substrate and a driving method, a display panel and a display device. An initialization control terminal of a first pixel circuit is coupled to an initialization control terminal of a second pixel circuit. The array substrate and the driving method, the display panel and the display device provided according to the embodiments of the disclosure may reduce the number of signal lines and the occupied space.

19 Claims, 6 Drawing Sheets

(56) References Cited

U.S. PATENT DOCUMENTS

2016/0086546 A1* 3/2016 Noh .................... G09G 3/3258
345/80

FOREIGN PATENT DOCUMENTS

| CN | 104091820 A | 10/2014 |
|----|-------------|---------|
| CN | 203982748 U | 12/2014 |
| CN | 203982749 U | 12/2014 |
| CN | 106504705 A | 3/2017 |

* cited by examiner

ARRAY SUBSTRATE AND DRIVING METHOD, DISPLAY PANEL AND DISPLAY DEVICE

CROSS REFERENCE TO RELATED APPLICATIONS

This patent application claims priority to Chinese Patent Application No. 201710388033.1, filed May 27, 2017, the disclosure of which is incorporated by reference herein in its entirety as part of the present application.

BACKGROUND

The embodiments of the disclosure relate to the field of display technology, and in particular, to an array substrate and a driving method, a display panel and a display device.

As display devices become thinner and thinner, the space left for circuit structures (such as pixel circuits) is getting smaller and smaller. How to optimize the circuit structures and the coupling manner in an array substrate to reduce the occupied space is the research focus.

In addition, the effects of coupling capacitors are becoming increasingly obvious between pixel circuits that are becoming increasingly close to each other, and a leakage current is more likely to occur, which affects the performance of the pixel circuits. For example, in a pixel circuit, when a capacitor storing the threshold voltage of a driving transistor is discharged due to the leakage current, it will be more difficult to perform an accurate compensation for a threshold drift of the driving transistor. It is also a research focus to improve the circuit structure and reduce the leakage current in small space.

BRIEF DESCRIPTION

Embodiments of the present disclosure provide an array substrate and a driving method, a display panel and a display device.

A first aspect of the present disclosure provides an array substrate, including a first pixel circuit and a second pixel circuit. An initialization control terminal of the first pixel circuit is coupled to an initialization control terminal of the second pixel circuit.

In embodiments of the present disclosure, the array substrate further includes a third pixel circuit. A data writing control terminal of the third pixel circuit is coupled to the initialization control terminal of the first pixel circuit and the initialization control terminal of the second pixel circuit.

In embodiments of the present disclosure, the initialization voltage terminal of the first pixel circuit and the initialization voltage terminal of the second pixel circuit are coupled to the same power line that provides an initialization voltage.

In embodiments of the present disclosure, a light emission control terminal of the first pixel circuit is coupled to a light emission control terminal of the second pixel circuit.

In embodiments of the present disclosure, at least one of the first pixel circuit and the second pixel circuit includes an initialization circuit, a data writing circuit, a compensation circuit, a storage circuit, a driving circuit, a light emission control circuit, and a light emission circuit. The initialization circuit is coupled to the storage circuit and configured to initialize the storage circuit. The data writing circuit is coupled to the storage circuit through the driving circuit and configured to write the data voltage into the storage circuit. The compensation circuit is coupled to the driving circuit and the storage circuit, and is configured to write the threshold voltage of the driving circuit into the storage circuit. The storage circuit is coupled to the driving circuit and configured to store a driving voltage for the driving circuit. The driving circuit is coupled to the light emission circuit through the light emission control circuit, and is configured to drive the light emission circuit to emit light according to the driving voltage stored by the storage circuit. The light emission control circuit is coupled to the driving circuit and the light emission circuit, and is configured to control the driving circuit to drive the light emission circuit.

In embodiments of the disclosure, the initialization circuit includes a first transistor. A control electrode of the first transistor is coupled to the initialization control terminal, a first electrode of the first transistor is coupled to the storage circuit, and a second electrode of the first transistor is coupled to an initialization voltage terminal.

In embodiments of the present disclosure, the first transistor is a double-gate transistor.

In embodiments of the present disclosure, the initialization circuit further includes a second transistor. A control electrode of the second transistor is coupled to the initialization control terminal, a first electrode of the second transistor is coupled to the initialization voltage terminal, and a second electrode of the second transistor is coupled to the light emission circuit.

In embodiments of the disclosure, the data writing circuit includes a third transistor. A control electrode of the third transistor is coupled to a data writing control terminal, a first electrode of the third transistor is coupled to the driving circuit, and a second electrode of the third transistor is coupled to a data voltage terminal.

In embodiments of the disclosure, the compensation circuit includes a fourth transistor. A control electrode of the fourth transistor is coupled to the data writing control terminal, and a first electrode and a second electrode of the fourth transistor are respectively coupled to the driving circuit.

In embodiments of the present disclosure, the storage circuit includes a first capacitor. A first electrode of the first capacitor is coupled to a first driving voltage terminal, and a second electrode of the first capacitor is coupled to the driving circuit.

In embodiments of the present disclosure, the driving circuit includes a fifth transistor. A control electrode of the fifth transistor is coupled to the storage circuit, a first electrode of the fifth transistor is coupled to the first driving voltage terminal through the light emission control circuit, and a second electrode of the fifth transistor is coupled to the light emission circuit through the light emission control circuit.

In embodiments of the present disclosure, the light emission control circuit includes a sixth transistor and a seventh transistor. A control electrode of the sixth transistor is coupled to a light emission control terminal, a first electrode of the sixth transistor is coupled to the driving circuit, and a second electrode of the sixth transistor is coupled to the light emission circuit. A control electrode of the seventh transistor is coupled to the light emission control terminal, a first electrode of the seventh transistor is coupled to the first driving voltage terminal, and a second electrode of the seventh transistor is coupled to the driving circuit.

In embodiments of the present disclosure, the light emission circuit includes an organic light emitting diode. A first electrode of the organic light emitting diode is coupled to the driving circuit through the light emission control circuit, and a second electrode of the organic light emitting diode is coupled to a second driving voltage terminal.

A second aspect of the present disclosure provides a driving method of an array substrate, for driving the array substrate described above, including initializing the first pixel circuit and the second pixel circuit simultaneously, writing a data voltage into the first pixel circuit, writing a data voltage into the second pixel circuit, controlling the first pixel circuit to emit light, and controlling the second pixel circuit to emit light.

In embodiments of the present disclosure, the first pixel circuit and the second pixel circuit are simultaneously controlled to emit light.

In embodiments of the present disclosure, the first pixel circuit and the second pixel circuit are initialized simultaneously in response to writing a data voltage into the third pixel circuit.

A third aspect of the present disclosure provides a display panel including the array substrate described above.

A fourth aspect of the present disclosure provides a display device including the display panel described above.

The array substrate and the driving method, the display panel and the display device provided according to the embodiments of the disclosure, may reduce the number of signal lines and the occupied space.

BRIEF DESCRIPTION OF THE DRAWINGS

In order to more clearly illustrate the technical solutions of the embodiments of the disclosure, the drawings of the embodiments will be briefly described below, and it should be appreciated that the drawings described below merely relate to some of the embodiments of the disclosure, rather than limit the disclosure, in which.

DETAILED DESCRIPTION

In order to make the technical solutions of the embodiments of the disclosure clearer, the technical solutions of the embodiments of the disclosure will be clearly and fully described below in conjunction with the accompanying drawings. It is obvious that the described embodiments are part, instead of all, of the embodiments of the disclosure. All other embodiments obtained by those skilled in the art based on the described embodiments of the disclosure without the need for creative labor also fall within the scope of the disclosure.

Figure 1:
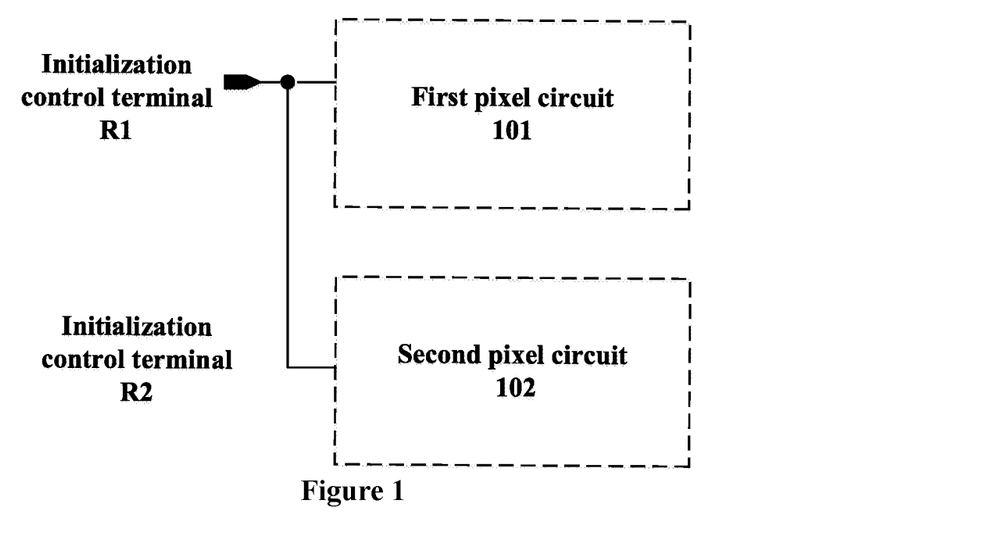
FIG. 1 is a schematic block diagram of two pixel circuits in an array substrate.

FIG. 1 is a schematic block diagram of two pixel circuits in an array substrate. Embodiments of the present disclosure provide an array substrate. The substrate includes a plurality of pixel circuits. As an example, FIG. 1 shows two of the pixel circuits therein, that is, a first pixel circuit 101 and a second pixel circuit 102. The initialization control terminal R1 of the first pixel circuit 101 and the initialization control terminal R2 of the second pixel circuit 102 may be coupled to each other. The manner of coupling includes a direct or indirect electrical connection.

In embodiments of the present disclosure, the initialization control terminal R1 of the first pixel circuit 101 and the initialization control terminal R2 of the second pixel circuit 102 are coupled to each other, and may be initialized simultaneously with the same control signal. This reduces the number of signal lines and reduces the occupied space.

Figure 2:
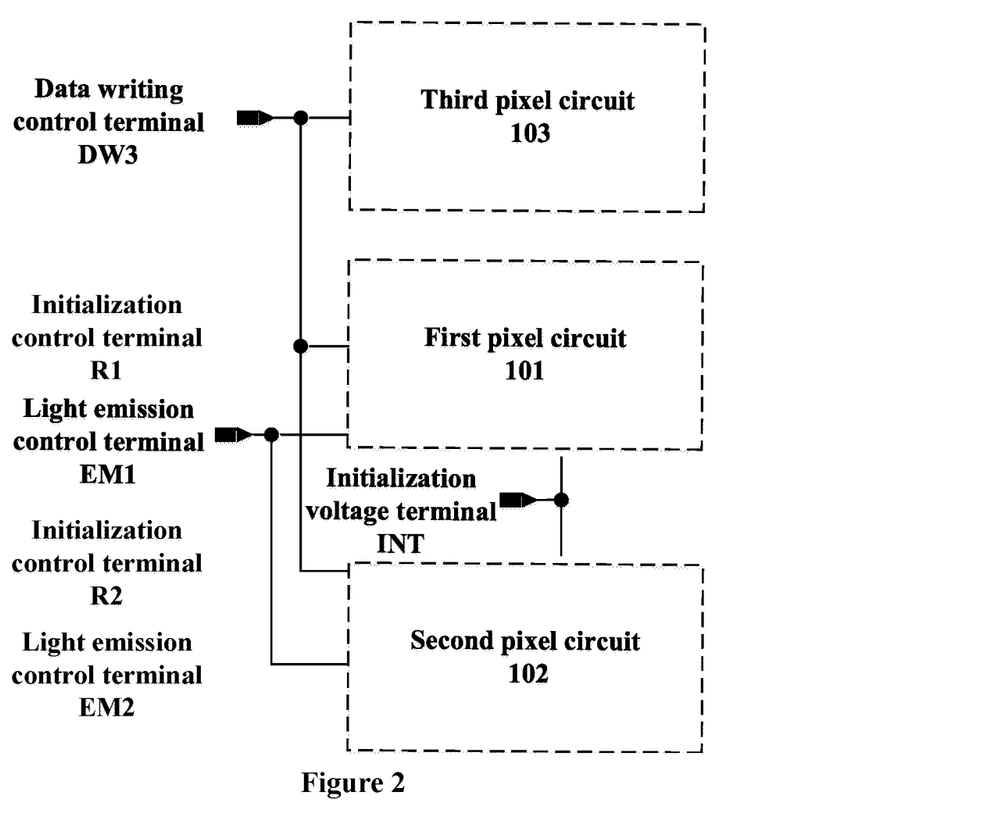
FIG. 2 is a schematic block diagram of three pixel circuits in an array substrate.

FIG. 2 is a schematic block diagram of three pixel circuits in an array substrate. As shown in FIG. 2, the plurality of pixel circuits of the array substrate further include a third pixel circuit 103. The data writing control terminal DW3 of the third pixel circuit 103 is coupled to the initialization control terminal R1 of the first pixel circuit 101 and the initialization control terminal R2 of the second pixel circuit 102. When data is written into the third pixel circuit 103, the first pixel circuit 101 and the second pixel circuit 102 may be initialized simultaneously to optimize the timing. This may further reduce the number of signal lines and reduce the occupied space.

It is also shown in FIG. 2 that the initialization voltage terminals INT of the first pixel circuit 101 and the second pixel circuit 102 are coupled to the same power line that provides an initialization voltage. Compared to coupling the first pixel circuit 101 and the second pixel circuit 102 respectively to different power lines providing the initialization voltage, this may further reduce the number of signal lines and the occupied space.

It is also shown in FIG. 2 that the light emission control terminal EM1 of the first pixel circuit 101 and the light emission control terminal EM2 of the second pixel circuit 102 may be coupled to each other. The first pixel circuit 101 and the second pixel circuit 102 may emit light simultaneously under the same control signal. This may further reduce the number of signal lines and the occupied space.

As an example, the data writing control terminal of the first pixel circuit 101 and the data writing control terminal of the second pixel circuit 102 are not coupled together. This may enable the time division multiplexing of the same data line for the first pixel circuit 101 and the second pixel circuit 102.

Figure 3:
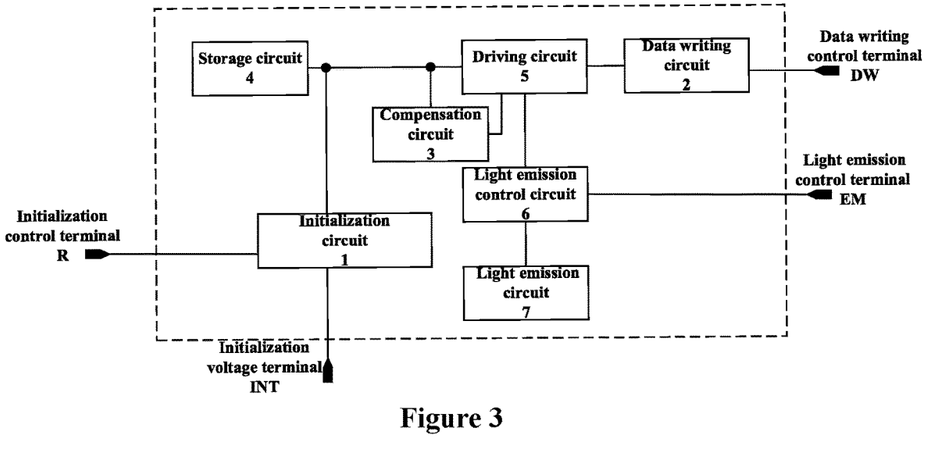
FIG. 3 is a schematic block diagram of a pixel circuit.

FIG. 3 is a schematic block diagram of a pixel circuit. Any one of the plurality pixel circuits of the array substrate may include an initialization circuit 1, a data writing circuit 2, a compensation circuit 3, a storage circuit 4, a driving circuit 5, a light emission control circuit 6, and a light emission circuit 7. The initialization circuit 1 is coupled to the storage circuit 4, and is configured to initialize the storage circuit 4. The data writing circuit 2 is coupled to the storage circuit 4 through the driving circuit 5 and is configured to write the data voltage into the storage circuit 4. The compensation circuit 3 is coupled to the driving circuit 5 and the storage circuit 4, and is configured to write the threshold voltage of the driving circuit 5 into the storage circuit 4. The storage circuit 4 is coupled to the driving circuit 5 and configured to store a driving voltage for the driving circuit 5. The driving circuit 5 is coupled to the light emission circuit 7 through the light emission control circuit 6 and is configured to drive the light emission circuit 7 to emit light according to the driving voltage stored in the storage circuit 4. The light emission control circuit 6 is coupled to the driving circuit 5 and the light emission circuit 7, and is configured to control the driving circuit 5 to drive the light emission circuit 7.

Figure 4:
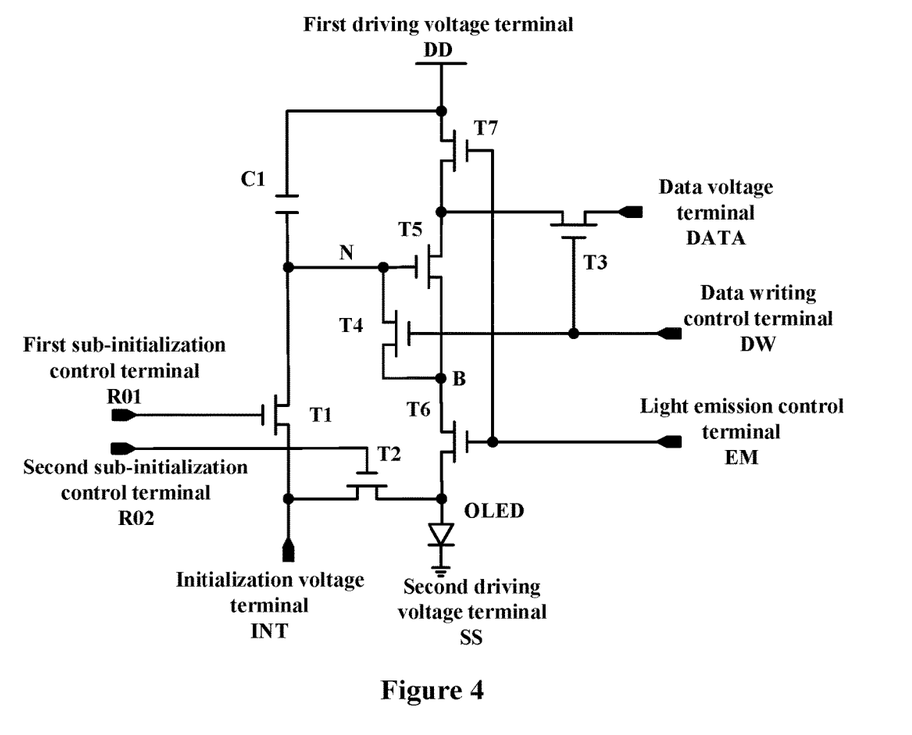
FIG. 4 is a schematic circuit diagram of a pixel circuit.

FIG. 4 is a schematic circuit diagram of a pixel circuit. As shown in FIG. 4, as an example, the initialization circuit 1 includes a first transistor T1. The control electrode of the first transistor T1 is coupled to the initialization control terminal R, the first electrode of the first transistor T1 is coupled to the storage circuit 4, and the second electrode of the first transistor T1 is connected to an initialization voltage terminal INT. The initialization circuit 1 may further include a second transistor T2. The control electrode of the second transistor T2 is coupled to the initialization control terminal R, the first electrode of the second transistor T2 is coupled to the initialization voltage terminal INT, and the second electrode of the second transistor T2 is coupled to the light emission circuit 7. The data writing circuit 2 includes a third transistor T3. The control electrode of the third transistor T3 is coupled to the data writing control terminal DW, the first electrode of the third transistor T3 is coupled to the driving circuit 5, and the second electrode of the third transistor T3 is coupled to the data voltage terminal DATA. The compensation circuit 3 includes a fourth transistor T4. The control electrode of the fourth transistor T4 is coupled to the data writing control terminal DW, and the first electrode and the second electrode of the fourth transistor T4 are respectively coupled to the driving circuit 5. The storage circuit 4 includes a first capacitor C1. The first electrode of the first capacitor C1 is coupled to the first driving voltage terminal DD, and the second electrode of the first capacitor C1 is coupled to the driving circuit 5. The driving circuit 5 includes a fifth transistor T5. The control electrode of the fifth transistor T5 is coupled to the storage circuit 4, the first electrode of the fifth transistor T5 is coupled to the first driving voltage terminal DD through the light emission control circuit 6, and the second electrode of the fifth transistor T5 is coupled to the light emission circuit 7. The light emission control circuit 6 includes a sixth transistor T6 and a seventh transistor T7. The control electrode of the sixth transistor T6 is coupled to the light emission control terminal EM, the first electrode of the sixth transistor T6 is coupled to the driving circuit 5 and the second electrode of the sixth transistor T6 is coupled to the light emission circuit 7. The control electrode of the seventh transistor T7 is coupled to the light emission control terminal EM, the first electrode of the seventh transistor T7 is coupled to the first driving voltage terminal DD and the second electrode of the seventh transistor T7 is coupled to the driving circuit 5. The light emission circuit 7 includes an organic light emitting diode OLED. The first electrode of the organic light emitting diode OLED is coupled to the driving circuit 5 through the light emission control circuit 6, and the second electrode of the organic light emitting diode OLED is coupled to the second driving voltage terminal SS.

Specifically, the initialization control terminal R includes a first sub-initialization control terminal R01 and a second sub-initialization control terminal R02. Although not shown in the figure, the first sub-initialization control terminal R01 and the second sub-initialization control terminal R02 may be coupled to each other. The control electrode of the first transistor T1 is coupled to the first sub-initialization control terminal R01, the first electrode of the first transistor T1 is coupled to the second electrode of the first capacitor C1, and the second electrode of the first transistor T1 is coupled to the initialization voltage terminal INT. The control electrode of the second transistor T2 is coupled to the second sub-initialization control terminal R02, the first electrode of the second transistor T2 is coupled to the initialization voltage terminal INT, and the second electrode of the second transistor T2 is coupled to the first electrode of the organic light emitting diode OLED. The control electrode of the third transistor T3 is coupled to the data writing control terminal DW, the first electrode of the third transistor T3 is coupled to the first electrode of the fifth transistor T5, and the second electrode of the third transistor T3 is coupled to the data voltage terminal DATA. The control electrode of the fourth transistor T4 is coupled to the data writing control terminal DW, the first electrode of the fourth transistor T4 is coupled to the control electrode of the fifth transistor T5, and the second electrode of the fourth transistor T4 is coupled to the second electrode of the fifth transistor T5. The first electrode of the first capacitor C1 is coupled to the first driving voltage terminal DD, and the second electrode of the first capacitor C1 is coupled to the control electrode of the fifth transistor T5. The control electrode of the fifth transistor T5 is coupled to the second electrode of the first capacitor C1, the first electrode of the fifth transistor T5 is coupled to the second electrode of the seventh transistor T7, and the second electrode of the fifth transistor T5 is coupled to the first electrode of the sixth transistor T6. The control electrode of the sixth transistor T6 is coupled to the light emission control terminal EM, the first electrode of the sixth transistor T6 is coupled to the second electrode of the fifth transistor T5, and the second electrode of the sixth transistor T6 is coupled to the first electrode of the organic light emitting diode OLED. The control electrode of the seventh transistor T7 is coupled to the light emission control terminal EM, the first electrode of the seventh transistor T7 is coupled to the first driving voltage terminal DD, and the second electrode of the seventh transistor T7 is coupled to the first electrode of the fifth transistor T5. The first electrode of the organic light emitting diode OLED is coupled to the second electrode of the sixth transistor T6, and the second electrode of the organic light emitting diode OLED is coupled to the second driving voltage terminal SS.

The initialization of the voltage at the second electrode (point N in the figure) of the first capacitor C1 is performed by the first transistor T1, and this initialization is completed before the data is written. The initialization of the voltage at the first electrode of the organic light emitting diode OLED is performed by the second transistor T2, and this initialization is completed before light emission. The both initialization may be done simultaneously or separately. Therefore, the control electrode of the first transistor T1 and the control electrode of the second transistor T2 may be coupled to each other or separated from each other. FIG. 4 shows a case where the control electrodes of the first transistor T1 and the second transistor T2 are not coupled to each other. In addition, the control electrodes of the first transistor T1 and the second transistor T2 may receive the same control signal for initializing at the same time, even when they are not coupled to each other.

As an example, the control electrode of a transistor may be a gate electrode, the first electrode of the transistor may be any one of the source electrode and the drain electrode, and the second electrode of the transistor may be the other of the source electrode and the drain electrode. The first electrode of the organic light emitting diode OLED may be any one of the positive electrode and the negative electrode, and the second electrode of the light emitting diode OLED may be the other of the positive electrode and the negative electrode.

In embodiments of the present disclosure, the first transistor T1 may be a dual-gate transistor to reduce the leakage current so as to prevent the voltage related to the threshold stored in the first capacitor C1 from drifting due to the leakage current flowing through the first transistor T1, and also better prevent the interaction between the first pixel circuit 101 and the second pixel circuit 102. This may improve the effect of compensating for the threshold voltage in a small space.

Figure 5:
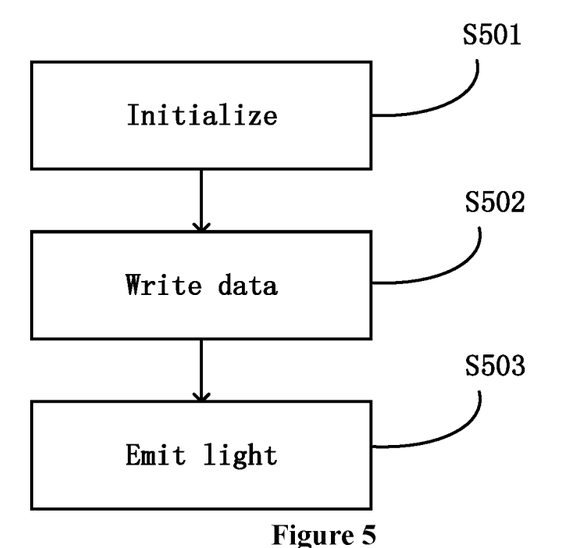
FIG. 5 is a schematic flow chart of a driving method of a pixel circuit.
Figure 6:
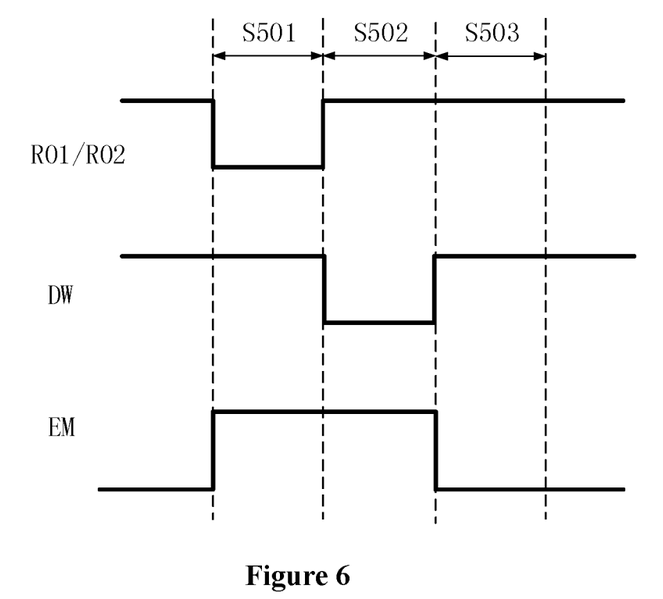
FIG. 6 is a schematic timing diagram of a pixel circuit.

FIG. 5 is a schematic flow chart of a driving method of a pixel circuit. FIG. 6 is a schematic timing diagram of a pixel circuit. The operation of the pixel circuit will be described below with reference to FIG. 5 and FIG. 6. For convenience of description, as an example, the transistors in the pixel circuit are all P-type transistors. It should be understood that the transistors in the pixel circuit may also be partially or fully replaced by N-type transistors.

As shown in FIG. 5, the driving method of the pixel circuit includes step S501, initialization, step S502, data writing, and step S503, light emission.

As shown in FIG. 6, in step S501, a low level voltage is applied to the first sub-initialization control terminal R01. The first sub-initialization control terminal R01 is coupled to the control electrode of the first transistor T1 in the initialization circuit 1, and therefore, the low level voltage turns on the first transistor T1 so as to couple the initialization voltage terminal INT and the second electrode of the first capacitor C1 in the storage circuit 4. The voltage of the second electrode (point N in the figure) of the first capacitor C1 is initialized to the initialization voltage supplied from the initialization voltage terminal INT. As an example, the initialization voltage may be the voltage of the ground of the power supply.

In addition, a high level voltage is applied to the data writing control terminal DW to turn off the third transistor T3 and the fourth transistor T4, to prevent the voltage of the data voltage terminal DATA from influencing the Voltage of the point N. A high level voltage is applied to the light emission control terminal EM to turn off the sixth transistor T6 and the seventh transistor T7, to prevent the voltages of the first driving voltage terminal DD and the second driving voltage terminal SS from influencing the voltage of the point N.

In this example, it is also possible to simultaneously apply a low level voltage to the second sub-initialization control terminal R02 to simplify the timing. The second sub-initialization control terminal R02 is coupled to the control electrode of the second transistor T2 in the initialization circuit 1, and therefore, the low level voltage turns on the second transistor T2 so as to couple the initialization voltage terminal INT and the first electrode of the organic light emitting diode OLED. The voltage of the first electrode of the organic light emitting diode OLED is initialized to the initialization voltage supplied from the initialization voltage terminal INT.

It should be understood that the "low level" voltage herein is intended to indicate that the voltage is a valid voltage that may turn on the P-type transistor, not to limit the amplitude of the voltage, for example, the amplitude of a low level voltage may be 0, and may also be negative. In the same way, the "high level" voltage is intended to indicate that the voltage is an invalid voltage that may turn off the P-type transistor, not to limit the amplitude of the voltage.

In step S502, a low level voltage is applied to the data writing control terminal DW. The data writing control terminal DW is coupled to the third transistor T3 in the data writing circuit 2 and the control electrode of the fourth transistor T4 in the compensation circuit 3, and therefore, the low level voltage turns on the third transistor T3 and the fourth transistor T4. Since the voltage of the point N is initialized to a low voltage in step S501, the fifth transistor T5 is also turned on. The data voltage terminal DATA is coupled to the first electrode of the fifth transistor T5, and is coupled to the control electrode (point N) of the fifth transistor T5 through the third transistor T3, the fifth transistor T5 and the fourth transistor T4. According to such coupling manner, there is a voltage difference between the first electrode and the control electrode of the fifth transistor T5, and this voltage difference is the threshold voltage. That is, the voltage change at the point N is Vn=Vdata−Vth, where Vn represents the voltage of the point N, Vdata represents the voltage of the data voltage terminal DATA, and Vth represents the threshold voltage of the fifth transistor T5. This voltage is held by the first capacitor C1.

In addition, a high level voltage is applied to the first sub-initialization control terminal R01 and the second sub-initialization control terminal R02, so as to turn off the first transistor T1 and the second transistor T2, to prevent the voltage of the initialization voltage terminal INT from influencing the voltage of the point N. A high level voltage is applied to the light emission control terminal EM to turn off the sixth transistor T6 and the seventh transistor T7, to prevent the voltages of the first driving voltage terminal DD and the second driving voltage terminal SS from influencing the voltage of the point N.

In step S503, a low level voltage is applied to the light emission control terminal EM. The light emission control terminal EM is coupled to the control electrodes of the sixth transistor T6 and the seventh transistor T7 of the light emission control circuit 6, and therefore, the low level voltage turns on the sixth transistor T6 and the seventh transistor T7. The first driving voltage terminal DD is coupled to the first electrode of the fifth transistor T5 through the seventh transistor T7. The voltage Vdd of the first driving voltage terminal DD is applied to the first electrode of the fifth transistor T5. The voltage of the control electrode of the fifth transistor T5 is Vn=Vdata−Vth. Therefore, the driving current generated by the fifth transistor T5 is $I=K[Vdd-(Vdata-Vth)-Vth]^2=K(Vdd-Vdata)^2$, where K is a constant related to the physical structure of the fifth transistor T5. The driving current I is independent of the threshold voltage Vth.

When the first transistor T1 is a dual-gate transistor, the leakage current may be further reduced, thereby preventing the voltage Vn related to the threshold stored in the first capacitor C1 from drifting due to the leakage current flowing through the first transistor T1. This may improve the effect of compensating for the threshold voltage in a small space.

In addition, a high level voltage is applied to the first sub-initialization control terminal R01 and the second sub-initialization control terminal R02, so as to turn off the first transistor T1 and the second transistor T2, to prevent the voltage of the initialization voltage terminal INT from influencing the driving current I. A high level voltage is applied to the data writing control terminal DW, so as to turn off the third transistor T3 and the fourth transistor T4, to prevent the voltage of the data voltage terminal DATA from influencing the driving current I.

The organic light emitting diode OLED emits light when being driven by the driving current I.

Figure 7:
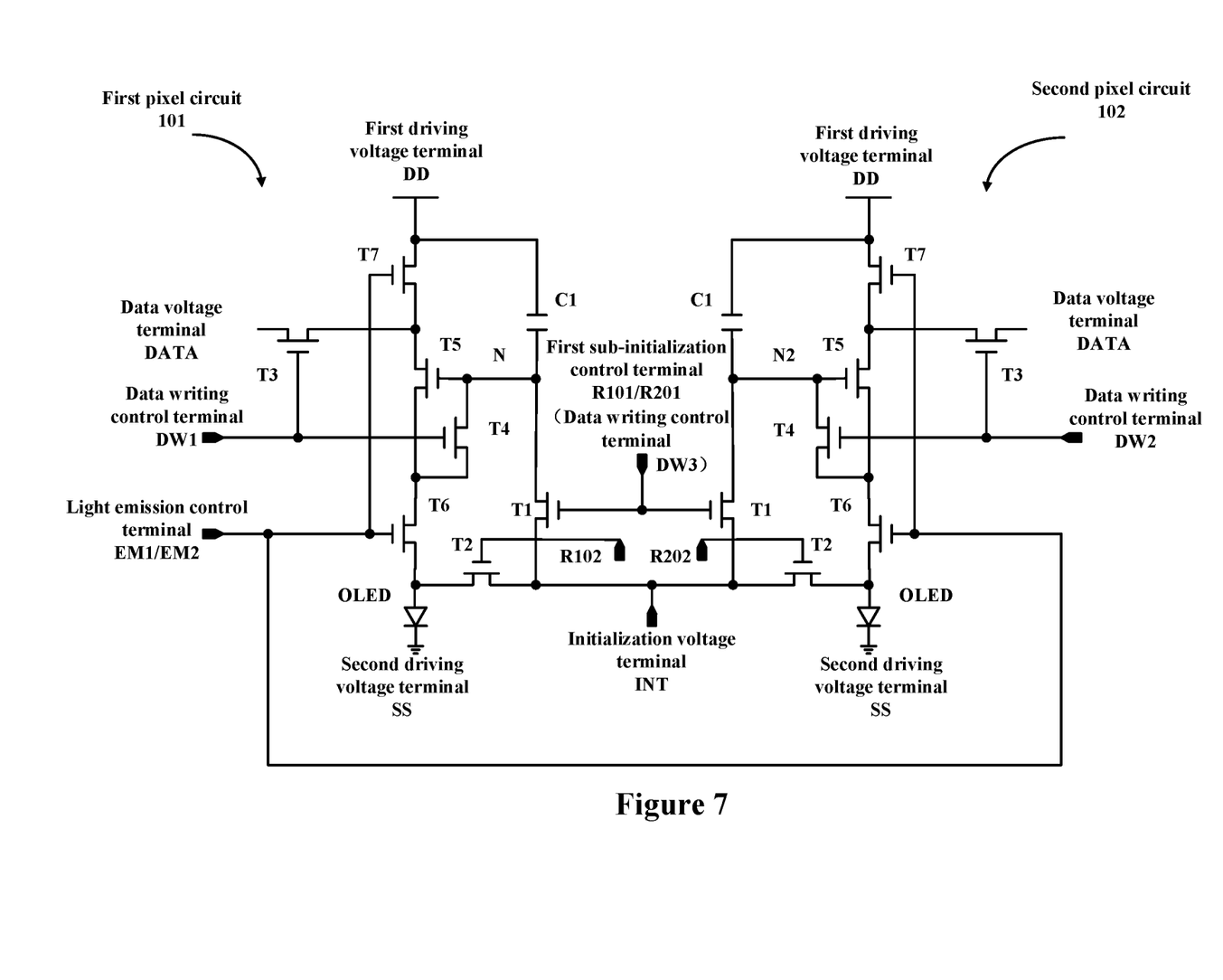
FIG. 7 is a schematic circuit structure diagram of two pixel circuits in an array substrate.

FIG. 7 is a schematic circuit structure diagram of two pixel circuits in an array substrate. As shown in FIG. 7, as an example, the first sub-initialization control terminal R101 of the first pixel circuit 101 is coupled to the first sub-initialization control terminal R201 of the second pixel circuit 102, and is coupled to the data writing control terminal DW3 of the third pixel circuit 103 (not shown). This may reduce the number of signal lines and reduce the occupied space.

In FIG. 7, the second sub-initialization control terminal R102 of the first pixel circuit 101 may be coupled to the data writing control terminal DW3 of the third pixel circuit 103 (not shown), or to the data writing control terminal DW1 of the first pixel circuit 101, as long as the initialization may be completed before the organic light emitting diode OLED of the first pixel circuit 101 emits light. The second sub-initialization control terminal R202 of the second pixel circuit 102 may be coupled to the data writing control terminal DW3 of the third pixel circuit 103 (not shown) or to the data writing control terminal DW1 of the first pixel circuit 101, or to the data writing control terminal DW2 of the second pixel circuit 102, as long as the initialization may be completed before the organic light emitting diode OLED of the second pixel circuit 102 emits light. This may also reduce the number of signal lines and reduce the occupied space.

The light emission control terminal EM1 of the first pixel circuit 101 is coupled to the light emission control terminal EM2 of the second pixel circuit 102, and the initialization voltage terminal of the first pixel circuit 101 and the initialization voltage terminal of the second pixel circuit 102 are coupled to the same power line supplying the initialization voltage, to further reduce the number of signal lines and reduce the occupied space.

Figure 8:
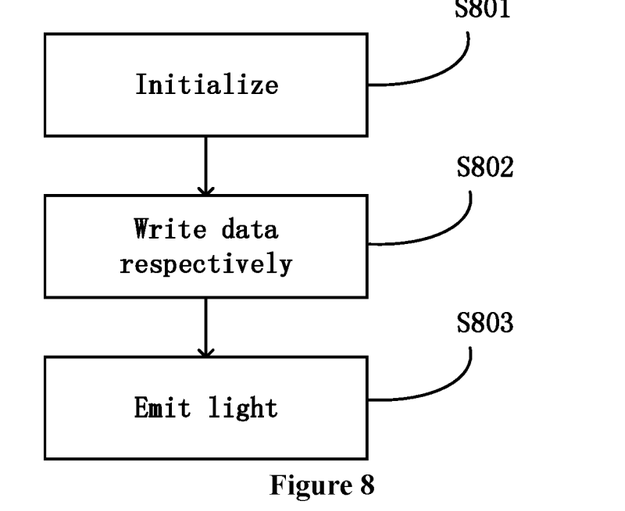
FIG. 8 is a schematic flow chart of a driving method of an array substrate.
Figure 9:
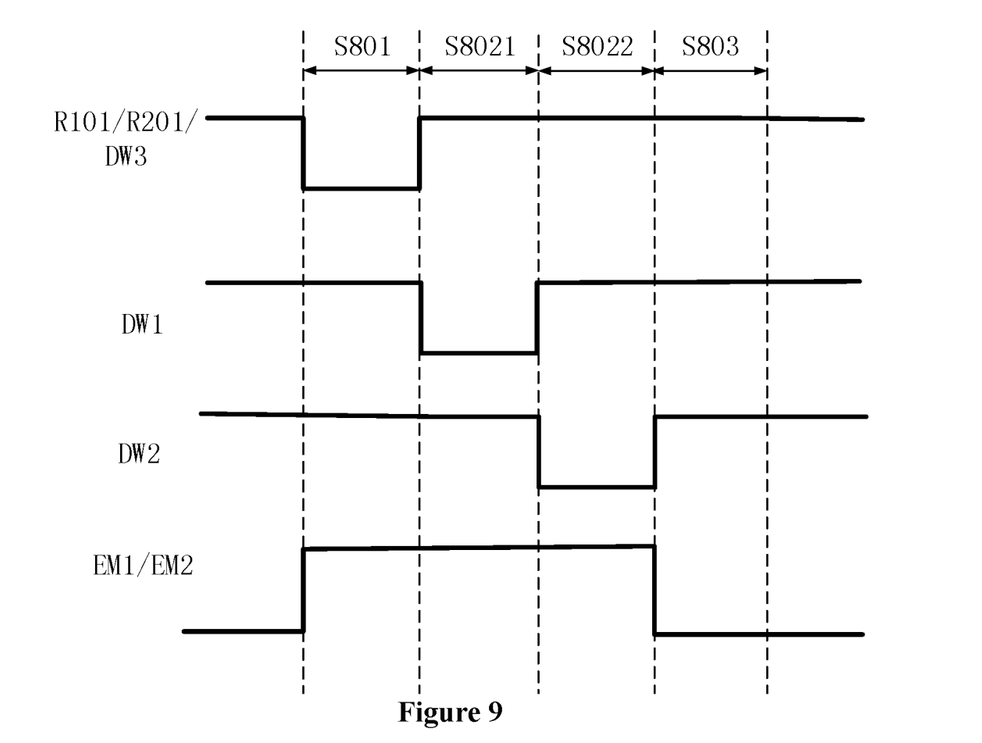
FIG. 9 is a schematic timing chart of an array substrate.

FIG. 8 is a schematic flow chart of a driving method of an array substrate. FIG. 9 is a schematic timing chart of an array substrate. The operation of the array substrate will be described below with reference to FIG. 8 and FIG. 9, and the description will be given by example of the first pixel circuit 101 and the second pixel circuit 102.

The first pixel circuit 101 and the second pixel circuit 102 may be two adjacent pixel circuits. As an example, in an array substrate scanned row by row, the first pixel circuit 101 and the second pixel circuit 102 may be two adjacent pixel circuits in the same column. In an array substrate in which the scanning is performed by row in groups, such as, in an array substrate in which the scanning is performed separately in odd rows and even rows, the first pixel circuit 101 and the second pixel circuit 102 may be two adjacent pixel circuits in the same column in the same group, such as, two adjacent pixel circuits in the same column of odd rows. Similarly, the third pixel circuit 103, the first pixel circuit 101 and the second pixel circuit 102 may be three adjacent pixel circuits.

As shown in FIG. 8, the driving method of the array substrate includes step S801, simultaneously initializing the first pixel circuit 101 and the second pixel circuit 102, step S802, writing the data voltage into the first pixel circuit 101, and writing the data voltage into the second pixel circuit 102, and step S803, controlling the first pixel circuit 101 to emit light and controlling the second pixel circuit 102 to emit light.

In embodiments of the present disclosure, the first pixel circuit 101 and the second pixel circuit 102 may be simultaneously controlled to emit light.

In embodiments of the present disclosure, the first pixel circuit 101 and the second pixel circuit 102 may be simultaneously initialized in response to writing the data voltage into the third pixel circuit 103.

As shown in FIG. 9, in step S801, a valid voltage, that is, a low level voltage is applied to the data writing control terminal DW3 of the third pixel circuit 103, the first sub-initialization control terminal R101 of the first pixel circuit 101, and the first sub-initialization control terminal R201 of the second pixel circuit 102 that are coupled together. When data is written into the third pixel circuit 103 (see step S502 shown in FIG. 5), the first pixel circuit 101 and the second pixel circuit 102 are initialized (see step S501 shown in FIG. 5).

In step S802, data is written into the first pixel circuit 101 and the second pixel circuit 102, respectively (see step S502 shown in FIG. 5). That is, step S802 includes step S8021, performing data writing on the first pixel circuit 101, and step S8022, performing data writing on the second pixel circuit 102. In step S8021, a valid voltage, that is, a low level voltage is applied to the data writing control terminal DW1 of the first pixel circuit 101. In step S8022, a valid voltage, that is, a low level voltage is applied to the data writing control terminal DW2 of the second pixel circuit 102.

In step S802, data writing is performed on the first pixel circuit 101 and the second pixel circuit 102 respectively, which facilitates the multiplexing of data lines, i.e., the data voltage terminal DATA of the first pixel circuit 101 and the data voltage terminal DATA of the second pixel circuit 102 may be coupled to the same data line. It should be understood that if the data voltage terminal DATA of the first pixel circuit 101 and the data voltage terminal DATA of the second pixel circuit 102 are respectively coupled to different data lines, data writing may be simultaneously performed on the first pixel circuit 101 and the second pixel circuit 102.

Referring to FIG. 5 and FIG. 6, while data writing is being performed, the first capacitor C1 stores the threshold voltage Vth of the fifth transistor T5.

In step S801 and step S802, an invalid voltage, i.e., a high level voltage is always applied to the light emission control terminal EM1 of the first pixel circuit 101 and the light emission control terminal EM2 of the second pixel circuit 102 that are coupled together, to prevent the organic light emitting diode OLED from emitting light.

In step S803, a valid voltage, i.e., a low level voltage is applied to the light emission control terminal EM1 of the first pixel circuit 101 and the light emission control terminal EM2 of the second pixel circuit 102 which are coupled together. The organic light emitting diodes OLEDs in the first pixel circuit 101 and the second pixel circuit 102 emit light (see step S503 shown in FIG. 5).

Referring to FIG. 5 and FIG. 6, the driving current I of the organic light emitting diode OLED is independent of the threshold voltage Vth.

Figure 10:
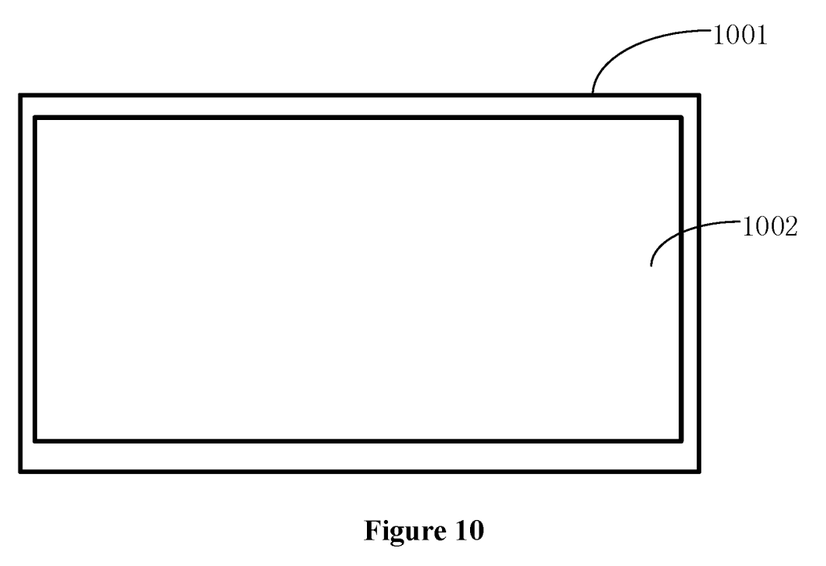
FIG. 10 is a schematic block diagram of a display panel and a display device.

FIG. 10 is a schematic block diagram of a display panel and a display device. As shown in FIG. 10, embodiments of the disclosure provide a display panel 1002, including the above mentioned array substrate. Embodiments of the disclosure provide a display device 1001, including the above mentioned display panel 1002. The display device 1001 may be any product or device with display function, such as a displayer, a television, a cellphone, a tablet computer, a navigator, or a digital photo frame, etc.

In embodiments of the present disclosure, the driving of the first pixel circuit 101 and the second pixel circuit 102 is synchronized, which reduces the number of required signals, and may reduce the number of levels of the gate driving array (GOA), saving the space occupied by the circuit structure.

The array substrate and the driving method, the display panel and the display device according to the embodiments of the present disclosure, may reduce the number of signal lines required by the pixel circuits, and reduce the occupied space. In addition, the disclosure may reduce the signal needed for the driving, reduce the number of levels of the gate driving array (GOA), and further save the space occupied by the circuit structure.

It may be understood that the above embodiments are merely exemplary embodiments used for illustrating the principle of the present disclosure, but the present disclosure is not limited thereto. For those of ordinary skill in the art, various variations and improvements may be made without departing from the spirit and essence of the present disclosure, and these variations and improvements are also considered to fall within the protection scope of the present disclosure.

What is claimed is:

1. An array substrate comprising:
a first pixel circuit; and
a second pixel circuit, wherein an initialization control terminal of the first pixel circuit is directly coupled to an initialization control terminal of the second pixel circuit;
wherein the array substrate further comprises a third pixel circuit, wherein a data writing control terminal of the third pixel circuit is directly coupled to the initialization control terminal of the first pixel circuit and the initialization control terminal of the second pixel circuit.

2. The array substrate according to claim 1, wherein the initialization voltage terminal of the first pixel circuit and the initialization voltage terminal of the second pixel circuit are coupled to the same power line that provides an initialization voltage.

3. The array substrate according to claim 1, wherein a light emission control terminal of the first pixel circuit is coupled to a light emission control terminal of the second pixel circuit.

4. The array substrate according to claim 1,
wherein at least one of the first pixel circuit and the second pixel circuit comprises an initialization circuit, a data writing circuit, a compensation circuit, a storage circuit, a driving circuit, a light emission control circuit, and a light emission circuit;
wherein the initialization circuit is coupled to the storage circuit and is configured to initialize the storage circuit;
wherein the data writing circuit is coupled to the storage circuit through the driving circuit and is configured to write a data voltage into the storage circuit;
wherein the compensation circuit is coupled to the driving circuit and the storage circuit, and is configured to write a threshold voltage of the driving circuit into the storage circuit;
wherein the storage circuit is coupled to driving circuit and is configured to store a driving voltage for the driving circuit;
wherein the driving circuit is coupled to the light emission circuit through the light emission control circuit, and is configured to drive the light emission circuit to emit light according to the driving voltage stored by the storage circuit; and
wherein the light emission control circuit is coupled to the driving circuit and the light emission circuit, and is configured to control the driving circuit to drive the light emission circuit.

5. The array substrate according to claim 4, wherein the initialization circuit comprises a first transistor, wherein a control electrode of the first transistor is coupled to the initialization control terminal, wherein a first electrode of the first transistor is coupled to the storage circuit, and wherein a second electrode of the first transistor is coupled to an initialization voltage terminal.

6. The array substrate according to claim 5, wherein the first transistor is a double-gate transistor.

7. The array substrate according to claim 5, wherein the initialization circuit further comprises a second transistor, wherein a control electrode of the second transistor is coupled to the initialization control terminal, wherein a first electrode of the second transistor is coupled to the initialization voltage terminal, and wherein a second electrode of the second transistor is coupled to the light emission circuit.

8. The array substrate according to claim 4, wherein the data writing circuit comprises a third transistor, wherein a control electrode of the third transistor is coupled to a data writing control terminal, wherein a first electrode of the third transistor is coupled to the driving circuit, and wherein a second electrode of the third transistor is coupled to a data voltage terminal.

9. The array substrate according to claim 4, wherein the compensation circuit comprises a fourth transistor, wherein a control electrode of the fourth transistor is coupled to the data writing control terminal, and wherein a first electrode and a second electrode of the fourth transistor are respectively coupled to the driving circuit.

10. The array substrate according to claim 4, wherein the storage circuit comprises a first capacitor, wherein a first electrode of the first capacitor is coupled to a first driving voltage terminal, and wherein a second electrode of the first capacitor is coupled to the driving circuit.

11. The array substrate according to claim 4, wherein the driving circuit comprises a fifth transistor, wherein a control electrode of the fifth transistor is coupled to the storage circuit, wherein a first electrode of the fifth transistor is coupled to the first driving voltage terminal through the light emission control circuit, and wherein a second electrode of the fifth transistor is coupled to the light emission circuit through the light emission control circuit.

12. The array substrate according to claim 4,
wherein the light emission control circuit comprises a sixth transistor and a seventh transistor;
wherein a control electrode of the sixth transistor is coupled to a light emission control terminal, a first electrode of the sixth transistor is coupled to the driving circuit, and a second electrode of the sixth transistor is coupled to the light emission circuit; and
wherein a control electrode of the seventh transistor is coupled to the light emission control terminal, a first electrode of the seventh transistor is coupled to the first driving voltage terminal, and a second electrode of the seventh transistor is coupled to the driving circuit.

13. The array substrate according to claim 4, wherein the light emission circuit comprises an organic light emitting diode, wherein a first electrode of the organic light emitting diode is coupled to the driving circuit through the light emission control circuit, and wherein a second electrode of the organic light emitting diode is coupled to a second driving voltage terminal.

14. A method for driving an array substrate according to claim 1, comprising:
initializing the first pixel circuit and the second pixel circuit simultaneously;
writing a first data voltage into the first pixel circuit;
writing a second data voltage into the second pixel circuit;
controlling the first pixel circuit to emit light; and
controlling the second pixel circuit to emit light.

15. The method according to claim 14, wherein the first pixel circuit and the second pixel circuit are simultaneously controlled to emit light.

16. The method according to claim 14, wherein the first pixel circuit and the second pixel circuit are initialized simultaneously in response to writing a third data voltage into a third pixel circuit.

17. A display panel comprising the array substrate according to claim 1.

18. A display device comprising the display panel according to claim 17.

19. An array substrate comprising:
a first pixel circuit;
a second pixel circuit; and
a third pixel circuit;
wherein each of the first pixel circuit, the second pixel circuit, and the third pixel circuit comprises a first transistor, a second transistor, a third transistor, a fourth transistor, a fifth transistor, a sixth transistor, a seventh transistor, a first capacitor, and an organic light emitting diode;
wherein a first electrode of the first transistor is coupled to a second electrode of the first capacitor, a second electrode of the first transistor is coupled to an initialization voltage terminal, a first electrode of the second transistor is coupled to the initialization voltage terminal, a second electrode of the second transistor is coupled to a first electrode of the organic light emitting diode, a control electrode of the third transistor is coupled to a control electrode of the fourth transistor, a first electrode of the third transistor is coupled to a first electrode of the fifth transistor, a second electrode of the third transistor is coupled to a data voltage terminal, a first electrode of the fourth transistor is coupled to the control electrode of the fifth transistor, a second electrode of the fourth transistor is coupled to a second electrode of the fifth transistor, a first electrode of the first capacitor is coupled to a first driving voltage terminal, the second electrode of the first capacitor is coupled to the control electrode of the fifth transistor, the control electrode of the fifth transistor is coupled to the second electrode of the first capacitor, the first electrode of the fifth transistor is coupled to a second electrode of the seventh transistor, the second electrode of the fifth transistor is coupled to a first electrode of the sixth transistor, a control electrode of the sixth transistor is coupled to a control electrode of the seventh transistor, the first electrode of the sixth transistor is coupled to the second electrode of the fifth transistor, a second electrode of the sixth transistor is coupled to the first electrode of the organic light emitting diode, a first electrode of the seventh transistor is coupled to the first driving voltage terminal, the second electrode of the seventh transistor is coupled to the first electrode of the fifth transistor, the first electrode of the organic light emitting diode is coupled to the second electrode of the sixth transistor, and a second electrode of the organic light emitting diode is coupled to a second driving voltage terminal; and
wherein the control electrode of the first transistor of the first pixel circuit, the control electrode of the first transistor of the second pixel circuit, and the control electrode of the third transistor of the third pixel circuit are directly coupled with each other.

* * * * *